US010524386B1

(12) United States Patent
Andre et al.

(10) Patent No.: US 10,524,386 B1
(45) Date of Patent: Dec. 31, 2019

(54) WATER COOLER ASSEMBLY AND SYSTEM (71) Applicant: ARCTIC (HK) Ltd, Hong Kong (HK)

(72) Inventors: Vincent Andre, Hong Kong (HK);
Magnus Huber, Hong Kong (HK)

(73) Assignee: ARCTIC (HK) Ltd, Hong Kong (HK)

( * ) Notice: Subject to any disclaimer, the term of this patent is extended or adjusted under 35 U.S.C. 154(b) by 0 days.

(21) Appl. No.: 16/006,098

(22) Filed: Jun. 12, 2018

(51) Int. Cl.
*H05K 7/20* (2006.01)
*H01L 23/473* (2006.01)
*F28F 3/08* (2006.01)
*G06F 1/20* (2006.01)

(52) U.S. Cl.
CPC .......... *H05K 7/20254* (2013.01); *F28F 3/08* (2013.01); *G06F 1/20* (2013.01); *H01L 23/473* (2013.01); *H05K 7/2039* (2013.01); *H05K 7/20272* (2013.01); *F28F 2250/08* (2013.01)

(58) Field of Classification Search
CPC .................................................... H01L 23/473
See application file for complete search history.

(56) References Cited

U.S. PATENT DOCUMENTS

| | | | | |
|---|---|---|---|---|
| 6,832,646 B1* | 12/2004 | Uomori | ................. | G06F 1/203 |
| | | | | 165/80.2 |
| 9,807,906 B2* | 10/2017 | Zhang | ................ | H05K 7/20272 |
| 9,823,028 B2* | 11/2017 | Zhang | ..................... | F28F 9/26 |
| 9,953,896 B2* | 4/2018 | Tsai | ..................... | H01L 23/473 |
| 10,185,351 B2* | 1/2019 | Yin | ........................ | G06F 1/16 |
| 10,198,046 B2* | 2/2019 | Tsai | ........................ | G06F 1/20 |
| 2009/0205809 A1* | 8/2009 | Wan | .................... | F28D 1/05366 |
| | | | | 165/80.4 |
| 2017/0192471 A1* | 7/2017 | Tsai | ........................ | G06F 1/20 |

* cited by examiner

*Primary Examiner* — Robert J Hoffberg (57) ABSTRACT

A heat transfer apparatus includes a first chamber horizontally offset from a second chamber to form an upper housing and a lower housing. The upper housing may be stacked on top of and fastened to the lower housing. The heat transfer apparatus may include a heat exchange interface fixed to a bottom surface of the lower housing. The heat exchange interface may absorb heat from a proximate heat source and transfer the absorbed heat to an inner surface of the lower housing. The apparatus includes a pump including an impeller and a stator disposed therein. The lower housing may separate the impeller from the stator so that the stator is isolated from the impeller by a surrounding casing. A liquid coolant may be circulated from an inlet, over the heat exchange interface and out to an outlet to remove heat from a processer proximate to the heat exchange interface.

20 Claims, 5 Drawing Sheets

WATER COOLER ASSEMBLY AND SYSTEM

BACKGROUND OF THE INVENTION

Field of the Invention

The present disclosure relates generally to systems and apparatuses for transferring computer processor generated heat from a heat exchange interface to a heat dissipating component. More specifically, the present disclosure relates to cooling a computer processing chip by placing a cold plate adjacent to the chip and removing the heat from the heated cold plate by circulating a liquid coolant over an opposite surface out to a radiator.

Description of the Related Art

Typical computer systems include heat-generating components that require cooling. Central processing units (CPUs) and graphics processing units (GPUs) are the most common heat generating electrical components in a computing device. Computer cooling systems are used to remove the waste heat produced by CPUs and GPUs and other heat generating computer components.

Heat transfer systems may be used in computing devices to transfer heat away from these heat generating computer components to heat dissipating components. For example, some systems may utilize a combination of fans and fins for removing heat by convection. As another example, passive heat exchangers exist that transfer heat generated by an electronic or mechanical device to a fluid medium to be dissipated away from the device.

The heat transfer processes preferably regulates the computing device's temperature to maintain optimal levels. Regulating a computer's temperature keeps computer components within permissible operating temperature limits.

Some computer cooling systems employ heat exchangers that transfer heat to a fluid coolant from a coolant reservoir, through fluid conduits interconnecting heat exchangers and the heat dissipating device, but the heat dissipating device may be in the form of a tubing coil and uses convective heat transfer. Water cooling often adds a considerable degree of complexity and cost to a design, with the cooling system requiring a pump, tubing or piping to transport the water, and a radiator, often with fans, to reject the heat to the atmosphere.

The desire for smaller, less-expensive and improved computing devices drives the need for new and improved configurations. Thus, there is a need for new and improved cooling system for computing devices.

SUMMARY OF THE INVENTION

According to an embodiment of the present invention, a novel heat transfer apparatus is provided which includes an upper housing and a lower housing. A cold plate may define a bottom surface of the lower housing. The heat transfer apparatus may also include a first chamber reservoir comprising a pump having an impeller and a stator. The pump may receive liquid coolant through an inlet in the upper housing and circulate the liquid coolant through a second chamber reservoir that may be in fluid communication with the first chamber reservoir. The first chamber reservoir may be horizontally offset from the second chamber reservoir so that a liquid or gas medium may flow in through the inlet, through the first chamber reservoir, then through a channel to the second chamber reservoir, and out through the outlet, wherein the channel may be configured to connecting the first chamber reservoir to the second chamber reservoir. As the liquid coolant traverses the cold plate in the lower housing, the liquid coolant may absorb heat absorbed by the cold plate and emanating from the proximate computer processing chip. The heated liquid coolant may be transferred from the second chamber reservoir to the radiator via an outlet offset from the inlet of the upper housing.

According to an embodiment of the present invention, a heat transfer apparatus for a computer component may comprise an upper housing stacked on top of and fastened to a lower housing to form an enclosure. The enclosure may include a first chamber horizontally offset from a second chamber. The enclosure may also include a pump comprising an impeller disposed within a stator, the impeller and stator may be disposed within the lower housing of the first chamber. The enclosure may also include an inlet disposed in a first aperture proximate to a center of the upper housing and an outlet disposed in a second aperture horizontally offset from the center of the upper housing, wherein the inlet may be in fluid communication with the pump in the first chamber and the outlet may be in fluid communication with the second chamber. The enclosure may further include a cold plate fixed to a bottom surface of the lower housing and the second chamber, wherein the cold plate may be configured to transfer heat from an adjacent heat source into the second chamber.

According to embodiments of the present invention, a heat transfer apparatus may further include a fan fixture removably secured to the upper housing. The fan fixture may comprise a first opening to receive the inlet and a second opening to receive the outlet. The fan fixture may also include a fan horizontally offset from the first opening and the second opening, wherein the fan, when energized circulates air throughout the immediate environment. The impeller of the heat transfer apparatus may include impeller blades arranged uniformly around a top surface of the impeller and extending out from a shaft fixed at a center of the impeller. The impeller may further include a magnet ring disposed within the inner structure of the impeller such that the impeller is partially secured around a shaft within the stator by a magnetic field generated by the magnetic ring. The second chamber may be defined between the lower housing and the cold plate, wherein the second chamber may be in fluid communication with the first chamber via at least one passageway offset from a center of the impeller.

According to an embodiment of the present invention, a system for cooling a central processor within a computing device may include a heat transfer apparatus that may include a housing defined by an upper portion stacked upon and fastened to a lower portion to form a first chamber horizontally offset from a second chamber. The heat transfer apparatus may further include a reservoir disposed within the first chamber and the second chamber, wherein the reservoir may include a plurality of channels configured to allow fluid communication from the first chamber to the second chamber. The heat transfer apparatus may further include a pump having an impeller disposed within the first chamber defined between the upper portion and the lower portion, wherein the pump may further include a stator disposed directly beneath the first chamber. The heat transfer apparatus may further include a heat exchange interface that may be fixed to a bottom portion of the housing to define a bottom surface of the housing, wherein a top surface of the computer processor may be coupled to or adjacent to a bottom surface of the heat exchange interface of the heat transfer apparatus.

According to an embodiment of the present invention, the heat transfer apparatus of the system may further include an inlet disposed in a first aperture proximate to a center of the upper portion of the housing, wherein the inlet may be in fluid communication with the first chamber. The heat transfer apparatus of the system may further include an outlet disposed in a second aperture offset from the center of the upper portion of the housing, wherein the outlet may be in fluid communication with the second chamber. The heat transfer apparatus of the system may further provide for the plurality of channels to be offset from a center of the impeller. The heat exchange interface of the system may be configured to absorb heat therein and transfer the heat to a liquid coolant that may pass over the heat exchange interface. The liquid coolant may be configured to absorb the heat and flow through the outlet and out to a heat dissipating device. The lower portion may be configured to separate the impeller from the stator to isolate the stator from the impeller.

According to an embodiment of the present invention, a method for cooling a heat generating computer component may include receiving a liquid coolant into a housing; transferring the liquid coolant to a pump comprising an impeller and a stator, wherein the pump may be disposed in a first chamber of the housing. The first chamber may be defined between an upper portion and a lower portion of the housing. The method may further include transferring the liquid coolant from the pump to a second chamber horizontally offset from the first chamber of the housing, wherein the second chamber may include a heat exchange interface affixed to a first bottom surface of the second chamber, and wherein the first bottom surface may substantially define a second bottom surface of the housing; and traversing the liquid coolant over the heat exchanging interface and out from the second chamber.

According to an embodiment of the present invention, the method may include receiving the liquid coolant may further include receiving the liquid coolant into an inlet of the upper portion of the housing; traversing the liquid coolant out from the second chamber through an outlet of the upper portion of the housing, wherein the outlet may be in fluid communication with the second chamber. The method may further include absorbing, at least by the liquid coolant, heat from the heat exchange interface to reduce a temperature of the heat exchange interface; transferring the liquid coolant from the pump to the second chamber via a plurality of passageways that are offset from a center of the impeller; transferring the liquid coolant to a heat dissipating device in fluid communication with the outlet; and circulating air throughout the immediate environment of the housing.

BRIEF DESCRIPTION OF DRAWINGS

Embodiments of the present invention are illustrated by way of example with reference to the accompanying drawings, which should not be construed to limit the present disclosure.

DETAILED DESCRIPTION OF THE PREFERRED EMBODIMENTS

Described in detail herein are apparatuses, systems, and methods for cooling a processor. Exemplary embodiments provide for providing an enclosure including an upper housing and a lower housing to receive a liquid coolant in an inlet of the upper housing and to transfer heated liquid coolant from an outlet of the upper housing to a heat dissipating device. Exemplary embodiments further provide an impeller and stator disposed within a first chamber reservoir to define a pump that receives and transfers the liquid coolant from the first chamber reservoir to a horizontally offset second chamber reservoir. The second chamber reservoir may include a bottom surface that substantially defines a heat exchange interface (or cold plate). The heat exchange interface may be positioned adjacent to or proximate to a computer processor, wherein the heat exchange interface absorbs heat generated by the computer processor. The absorbed heat may then be transferred to the liquid coolant as it passes over the heat exchange interface proximate to a bottom surface of the second chamber reservoir. Further example embodiments provide for transferring the heated liquid coolant out the second chamber reservoir though an outlet affixed to the upper housing.

The apparatuses described herein can provide a heat transfer device using a liquid coolant medium. The heat transfer apparatus may include a housing that may be defined by an upper housing (or upper portion) secured to a lower housing (or lower portion). Further, the heat transfer apparatus may include a first chamber reservoir horizontally offset from a second chamber reservoir. The heat transfer apparatus may further include a pump having an impeller and a stator. The impeller may be disposed within the first chamber that may be defined between the upper housing and the lower housing. The stator may be disposed directly beneath the first chamber, wherein the lower housing may separate the impeller from the stator so that the stator can be isolated from the impeller. The second chamber may be defined between the lower housing and the heat exchange interface (or cold plate), wherein the second chamber may be in fluid communication with the first chamber via passageways. The passageways may be configured to be offset from a center of the impeller.

The heat transfer apparatus may be fastened to a computing device processor (e.g. computer processing unit (CPU), graphics processing unit (GPU)) or any other heat generating device such that the heat exchange interface is physically contacting the computing device processor. The first chamber may receive a liquid coolant, which may be chilled or at a temperature below a predetermined threshold, and circulate the liquid coolant via the impeller through the passageways and into the second chamber. An inlet may be affixed to a first opening proximate to the center of the upper housing. An inlet may be affixed to the upper housing and configured to receive a heat-transfer medium and supply the heat-transfer medium to a reservoir or the first chamber. The inlet may be positioned at any location of the upper housing so long as the inlet will be in fluid communication with the reservoir or the first chamber to provide the heat-transfer medium to the pump in the first chamber.

The liquid coolant that enters the second chamber may be dispersed along channels that may be formed in the upper surface of the heat exchange interface.

As the liquid coolant traverses the heat exchange interface, the liquid coolant absorbs heat conducted from the computing device processor. The heated liquid coolant may then be directed through an outlet that may be formed in the upper housing. The outlet may be in fluid communication with a heat dissipating device, which may receive the heated liquid coolant to return to a lower temperature. In other words, the heated liquid coolant may be transferred out from the second chamber through an outlet in the upper housing for cooling at a heat dissipation device. The outlet may be positioned at any location of the upper housing so long as the outlet will be in fluid communication with the reservoir or the second chamber to receive the heat-transfer medium from and disbursement out of the second chamber.

Figure 1:
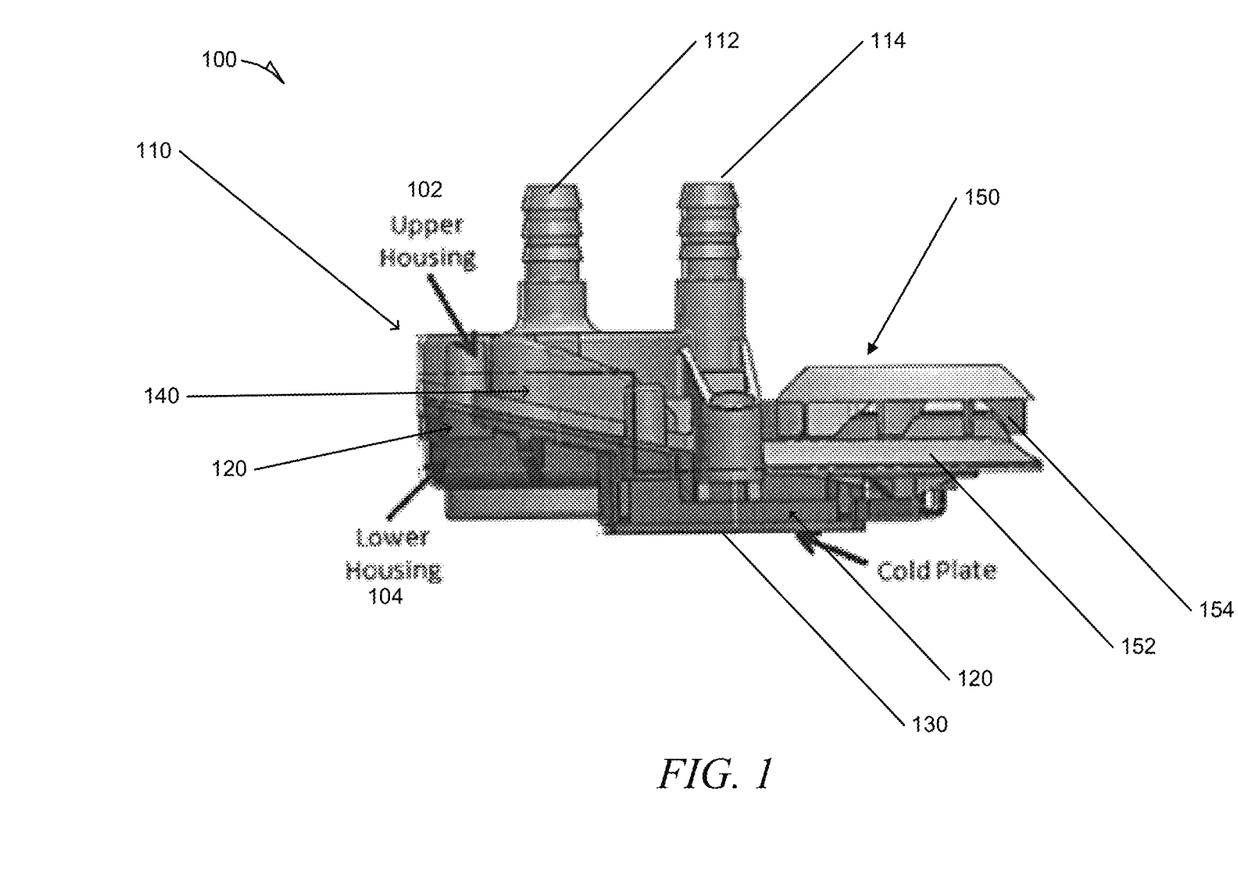
FIG. 1 illustrates a side view of a heat transfer apparatus, according to an example embodiment.

Referring to FIG. 1, according to an embodiment of the present invention, a heat transfer apparatus 100 may include an upper housing 102 which may be stacked on top of and fastened to a lower housing 104 to form a first chamber 110 horizontally offset from a second chamber 120. The first chamber 110 may be horizontally offset from the second chamber 120 such that the first chamber 110 and the second chamber 120 form a dual chambered lateral enclosure secured by the upper housing 102 and the lower housing 104. The first chamber 110 may also be slightly elevated above the second chamber 120. Such slight elevation may allow for gravity to assist in the flow of a fluid from the first chamber into the second chamber. The chambers may be offset in other arrangements to satisfy the design parameters. For example, the second chamber 120 may be slightly elevated above the first chamber 110 while still being horizontally offset from each other.

The heat transfer apparatus 100 may also include a heat exchange interface 130 (or cold plate) that may be fixed to a bottom surface of the lower housing. The heat exchange interface 130 may also be positioned at the lowest center of the heat transfer apparatus 100 and/or may be fixed between the first chamber 110 and the second chamber 120. The heat exchange interface 130 may be configured to absorb heat from a proximate heat generating device or heat source and transfer the absorbed heat to an inner surface of the lower housing. The heat exchange interface 130 may include fins (not shown) to improve heat transfer by either creating turbulent flow and reducing thermal resistance or increasing fin density to increase the heat transfer area, as known to one of ordinary skill in the art.

The second chamber 120 may be positioned between the heat exchange interface 130 and the upper housing 102, such that the lower housing 104 may form a wall or exterior boundary of the second chamber 120. In other words, a bottom portion of the lower housing 104 may form a partial barrier between the cold plate and the second chamber 120. However, the bottom portion of the lower housing 104 may include an opening comprising fins to allow fluid or air communication from an inner surface of the heat exchange interface 130 (cold plate) into the second chamber 120. The fins may be arranged in any manner to allow any medium to flow there through. For example, the fins may louvered, lanced offset, wavy, or straight. Fins improve heat transfer in two ways. One way is by creating turbulent flow through fin geometry, which reduces the thermal resistance (the inverse of the heat transfer coefficient) through the nearly stagnant film that forms when a fluid flows parallel to a solid surface. A second way is by increasing the fin density, which increases the heat transfer area that comes in contact with the fluid. Fin geometries and densities that create turbulent flow and improve performance also increase pressure drop, which is a critical requirement in most high performance applications. The optimum fin geometry and fin density combination is then a compromise of performance, pressure drop, weight, and size. Aside from fin geometry, parameters such as thickness, height, pitch, and spacing can also be altered to improve performance. Typically, fin thicknesses vary from 0.004 in (0.1 mm) to 0.012 in (0.3 mm), heights vary from 0.035 in (0.89 mm) to 0.6 in (15.24 mm), and densities vary from 8 to 30 FPI (Fins per Inch).

In another example embodiment, the heat transfer apparatus 100 may be configured such that the second chamber 120 may be defined between the lower housing and the heat exchange interface 130 or cold plate 130. The second chamber 120 may be in fluid communication with the first chamber 110 via a plurality of passageways. The plurality of passageways may be offset from a center of the impeller 140.

In another example embodiment, the heat transfer apparatus 100 may include an inlet 112 affixed to a first opening or first aperture of the upper housing 102. The first opening may be proximate to a center of the upper housing, wherein the inlet 112 may be configured to receive a heat-transfer medium from an external source. The heat-transfer medium may be a liquid coolant, gas coolant, or any other type of heat absorbing medium known to those of ordinary skill in the art. The heat transfer apparatus 100 may be configured to allow the heat-transfer medium to flow into a reservoir that is in fluid communication with the inlet 112. The reservoir may be defined by a first chamber 110 and a second chamber 120, wherein the first chamber 110 may be aligned horizontally offset from the second chamber 120. In other words, the first chamber 110 may be horizontally aligned with the second chamber 120 such that the first chamber 110 is not positioned vertically above the second chamber 120, although the first chamber 110 may be slightly elevated above the second chamber 120.

In another example embodiment, the heat transfer apparatus 100 may be configured such that the impeller (not shown, but internal to the lower housing) may be disposed in the first chamber 110 and positioned between the upper housing 102 and the lower housing 104. The upper housing 102 may substantially include the first chamber 110 and the lower housing 104 may substantially include the second chamber 120. The stator (not shown) may be disposed entirely within the lower housing 104 and configured to receive the impeller within a groove shaped and sized in accordance with the shape and size of the impeller. By the nature of the impeller and the stator being disposed within the lower housing 104, the stator may also be disposed directly beneath or underneath the first chamber 110. The upper housing 102 may include an aperture or slot to receive a shaft of the impeller to secure the impeller shaft in place to reduce vertical movement of the shaft when in motion, as will be described further herein.

In another example embodiment, the heat transfer apparatus 100 may include a fan fixture 150 which may be removably secured to the upper housing 102. The fan fixture may include a first opening to receive the inlet 112 and a second opening to receive the outlet 114. The fan fixture 150 may also include a fan 152, having blades 154, horizontally offset from the first opening and the second opening, but fixed within the same uniform body of the fan fixture 150. The fan 152 may be configured to circulate air throughout the immediate environment internal and external to the heat transfer apparatus 100. The fan 152 may be powered by any external power source to the heat transfer apparatus 100 or powered by a power source made available to the heat transfer apparatus 100.

Figure 2:
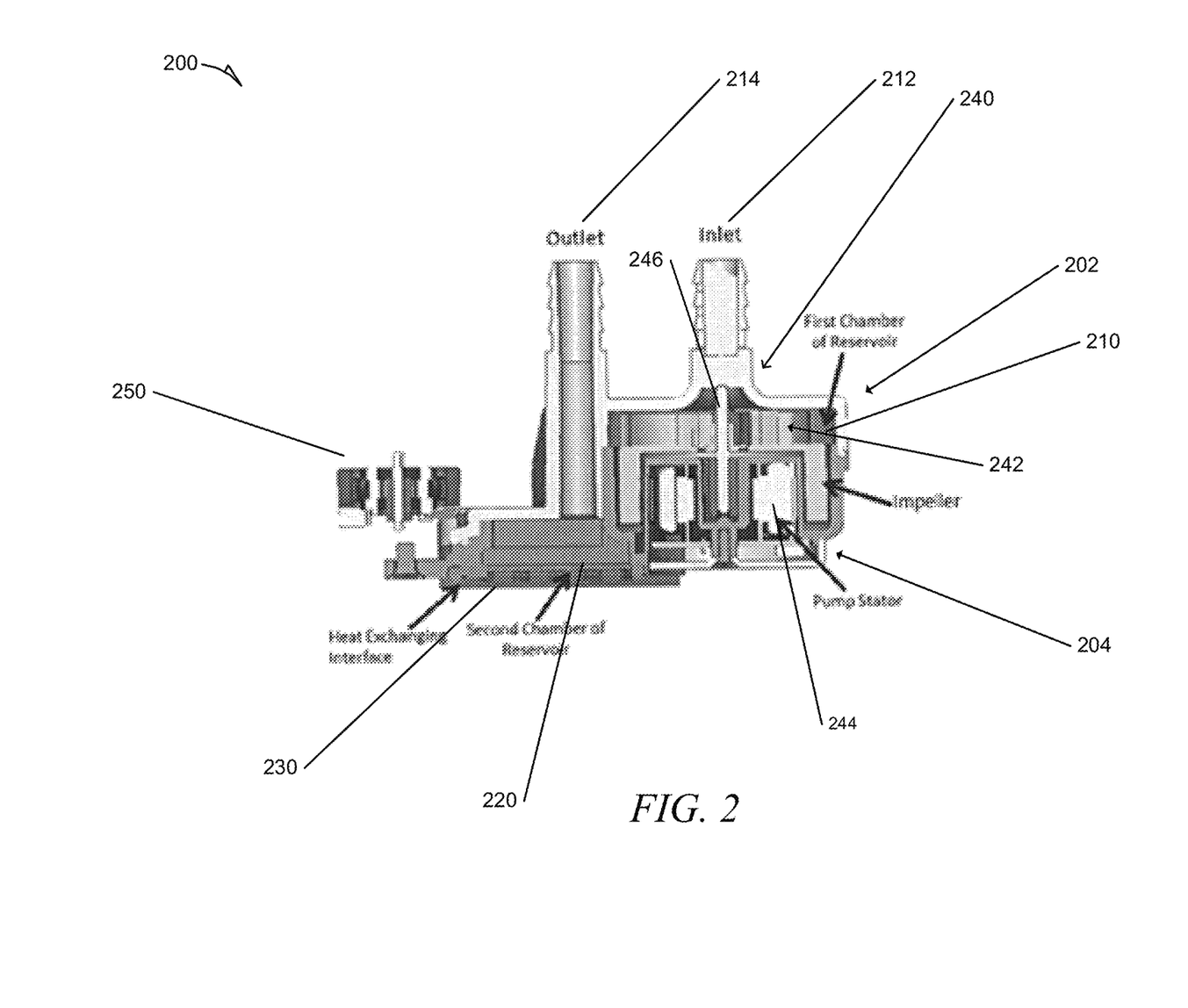
FIG. 2 illustrates a cross-sectional view of a heat transfer apparatus, according to an example embodiment.

In an example embodiment, as illustrated in FIG. 2, a system for cooling a processor may include a heat transfer apparatus 200 embodied by a housing defined by an upper portion stacked upon and fastened to a lower portion to form a first chamber 210 horizontally offset from a second chamber 220. A reservoir may be defined within the first chamber 210 and the second chamber 220, wherein the reservoir may include a plurality of channels throughout which may be configured to allow fluid communication from the first chamber 210 to the second chamber 220. The plurality of channels may be configured to be offset from a center of the impeller 242.

The heat transfer apparatus 200 may further include a pump 240 that may include an impeller 242 and a stator 244 disposed within the pump 240. The lower housing 204 may be configured to separate the impeller 242 from the stator 244 so that the stator 244 is isolated from the impeller 242. For example, the impeller 242 may be configured to fit within in a cavity of an upper section of the first chamber 210 but also secured to the lower housing 204 by a shaft 246. The impeller 242, when secured to the lower housing 204, may be configured to occupy the area around the upper and surrounding interior walls of the first chamber 210. The lower housing 204 may be positioned to separate the first chamber 210 from the stator 244, thereby allowing access to the stator from the bottom of the enclosure. The stator 244 may be secured to a bottom surface of the lower housing 204 and configured to receive the impeller 242 around a top portion of the stator 244. The stator 244 may be isolated from the first chamber 210 by a surrounding casing, but secured at its center to the lower housing 204 by an axial portion. The axial portion may be configured to receive one end of the shaft 246 such that, when received, the shaft 246 secures the impeller 242 to surrounding casing of the stator 244. The shaft 246 may also be fixed to the impeller 242 such that when the shaft 246 rotates, the impeller 242 rotates proportionally. In this configuration, the impeller 242 is free to rotate about the shaft 246 when an energy force is applied thereto. When the impeller 242 rotates about the shaft 246, it also rotates about the stator 244, although the stator is isolated from the impeller 242 by the surrounding casing of the stator 244. Alternatively, the shaft 246 may be fixed to its foundation secured in the housing such that the impeller 242 only rotates around the fixed shaft 246. The heat transfer apparatus 200 may further include a fan fixture 250 which may be removably secured to the upper housing.

The pump 240 of the system for cooling a processor may also provide for an impeller 242 to be disposed within the first chamber 210 that may be defined between the upper portion and the lower portion of the housing. The pump 240 may also include the stator 244 that may be disposed directly beneath the first chamber. The lower portion may be configured or arranged to separate the impeller 242 from the stator 244 to isolate the stator 244 from the impeller 242. The stator 244 may be isolated from the first chamber 210 by a surrounding casing as described above herein.

The system of this example embodiment may further provide for the impeller 242 to be disposed in the first chamber 210 and positioned between the upper housing 202 and the lower housing 204. The upper housing 202 may substantially include the first chamber 210 and the lower housing 204 may substantially include the second chamber 220. The stator 244 may be disposed entirely within the lower housing 204 and configured to receive the impeller 242 within a groove shaped and sized in accordance with the shape and size of the impeller 242. By the nature of the impeller 242 and the stator 244 being disposed within the lower housing 204, the stator 244 may also be disposed directly beneath or underneath the first chamber 210. The upper housing 202 may include an aperture or slot to receive a shaft 246 of the pump 240 to secure the impeller shaft in place to reduce vertical movement of the shaft 246 when in motion.

The system for cooling a processor may also include a heat exchange interface 230 that may be affixed to a bottom portion of the housing to form a part of a bottom surface of the housing. The heat exchange interface 230 may also be affixed to a bottom surface of the second chamber 220 such that a top surface of the heat exchange interface 230 is exposed to the second chamber 220 reservoir and a bottom surface of the heat exchange interface 230 may be proximate to or adjacent to an external surface of the housing or an external surface of the second chamber 220. Alternatively, the heat exchanging surface 230 may be disposed beneath a bottom surface of the second chamber 220 or second chamber of the reservoir. The heat exchanging interface 230 may form part of the bottom surface of the second chamber 220 and may include an opening, comprising fins, to allow fluid or air communication from an inner surface of the heat exchange interface 230 into the second chamber 220.

The impeller 242 may include impeller blades and a magnet ring fixed to a core of the impeller. The magnet ring may be disposed within the inner structure of the impeller 242 such that the impeller blades fan out from the magnet ring. However, the magnet ring may be a separate structure from the impeller blades but still form the impeller 242 as a single unit. The impeller 242 may be fixed in an upward or downward orientation. Also, the impeller 242 may be positioned above, below or in vertical alignment with the stator 244. However, the impeller 242 may be aligned with the same planar axis as the stator 244 to allow impeller 242 movement substantially within the stator 244.

The system for cooling a processor may further include a computing device processor, wherein a top surface of the computer processor may be coupled to or adjacent to a bottom surface of the heat exchange interface 230 of the heat transfer apparatus 200. The computing device processor may be a central processing unit (CPU), graphical processing unit (GPU) or any other computing device that is known to those of ordinary skill in the art to generate heat.

The system for cooling a processor may also include an inlet 212 disposed in a first aperture proximate to a center of the upper portion of the housing of the heat transfer apparatus 200. The inlet 212 may be positioned at any location in the upper portion of the housing such that, when the inlet 212 receives water, the water may be guided around the center of the impeller 242 or to the second chamber 220. The inlet 212 may be configured to be in fluid communication with the first chamber 210. The inlet 212 may also be in fluid communication with the pump 240 to allow a liquid or gas medium to flow from an opening in a first end of the inlet 212 to the aperture of the upper portion of the housing. The inlet 212 into the first chamber 210 may be always be configured to allow fluid communication into the center of the impeller 242. However, the inlet 212 may be in fluid communication with a channel that eventually leads up to the center of the impeller 242.

The system for cooling a processor may also include an outlet 214 disposed in a second aperture offset from the center of the upper portion of the housing of the heat transfer apparatus 200. The outlet 214 may be configured to be in fluid communication with the second chamber 220. The outlet 214 may be configured to transfer liquid coolant from the second chamber 220 to a radiator or heat dissipating device. The second chamber 220 may be configured to receive the liquid coolant from the first chamber 210 and direct a flow of the liquid coolant over the internal surface of the heat exchange interface 230. Further, the second chamber 220 may be configured to further direct the flow of the liquid coolant from the heat exchange interface 230 internal surface and through a distal opening in the outlet 214. The outlet 214 may be configured to always be on the side of or horizontally offset from the impeller 242. There may be at least one or more outlets which may guide the water into separate channels or into one channel.

The heat exchange interface 230 may be configured to absorb heat generated from the proximal heat generating computing processing device. The heat exchange interface 230 may also be configured to transfer the absorbed heat to a liquid coolant that traverses an internal surface of the heat exchange interface 230, wherein the internal surface is within the second chamber 220 of the reservoir. The internal surface may include a plurality of grooves or channels that permit directional flow of the liquid coolant towards the outlet 214. The second chamber 220 may be in fluid communication with the first chamber 210 via passageways or channels that may be offset from a center of the impeller.

The heat exchange interface 230 may be configured to absorb heat therein and may be configured to transfer the heat to a liquid coolant that traverses or passes over the internal surface of the heat exchange surface. The liquid coolant may be configured to absorb the heat and direct the liquid coolant to flow through the outlet 214. Once the liquid coolant has passed through the outlet 214, the liquid coolant may be directed to a heat dissipating device. The heat dissipating device may be a radiator, heat sink or any other device known to those of ordinary skill in the art to receive a heat containing medium and transfer heat from that medium to another medium, thereby removing the heat from the liquid coolant.

Figure 3:
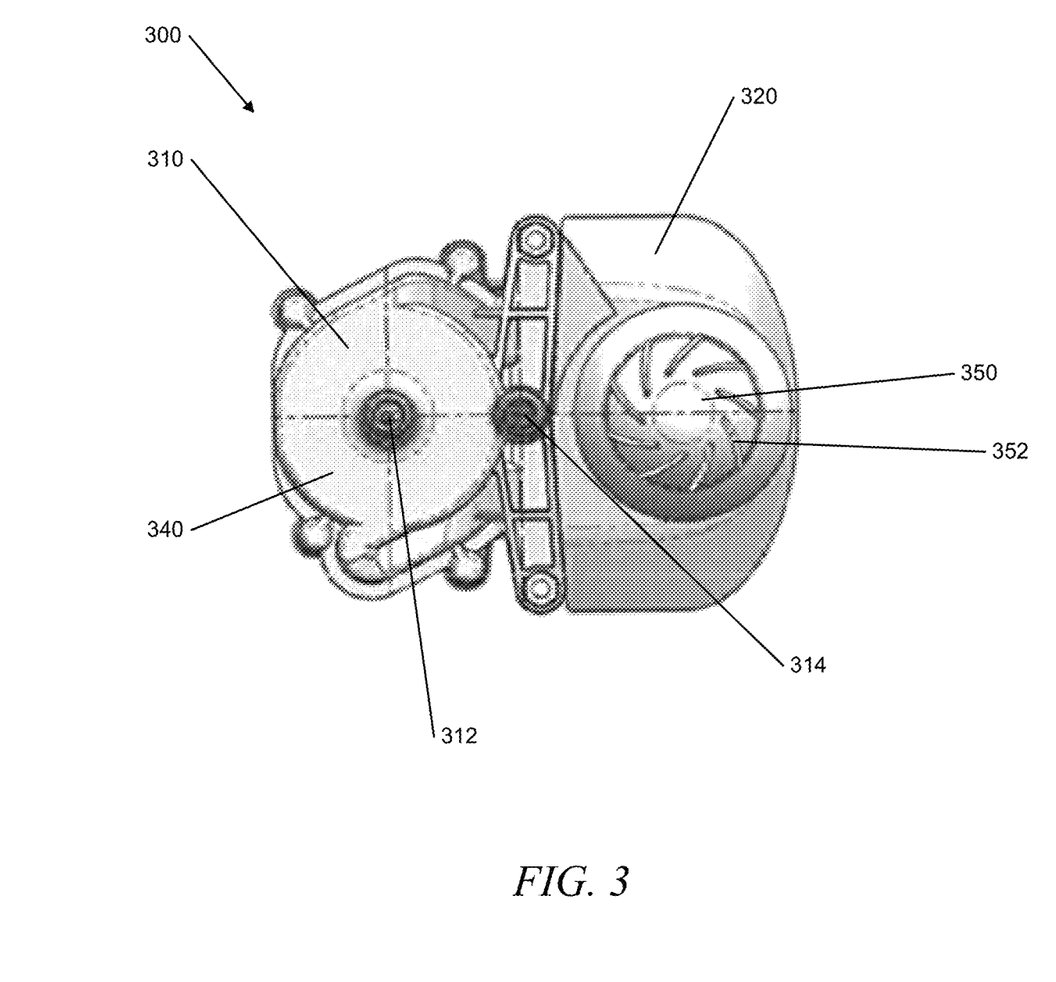
FIG. 3 illustrates a top view of a heat transfer apparatus, according to an example embodiment.

According to another example embodiment, a heat transfer apparatus 300 is shown in FIG. 3. The heat transfer apparatus 300 may include a first chamber 310 horizontally offset from a second chamber 320. The heat transfer apparatus 300 may also include an upper housing stacked on top of and fastened to a lower housing to define an enclosure for the heat transfer apparatus 300. The heat transfer apparatus 300 may also include a heat exchange interface (or cold plate)—not shown—that may be fixed to a bottom surface of the lower housing. The heat exchange interface may be configured to absorb heat from a proximate heat generating device or heat source and transfer the absorbed heat to an inner surface of the lower housing. The heat transfer apparatus 300 may further include a pump 340 that may include an impeller—not shown—and a stator—not shown—disposed within the pump 340. The lower housing may be configured to separate the impeller from the stator so that the stator is isolated from the impeller. For example, the impeller may be positioned in an upper section of the upper housing and the stator may be secured to within a lower section of the lower housing, as described above herein. The lower housing may be positioned to separate the first chamber 310 from the stator via a surrounding casing of the stator, thereby allowing access to the stator from the bottom of the enclosure.

In another example embodiment, the heat transfer apparatus 300 may be configured such that the second chamber 320 may be defined between the lower housing and the heat exchange interface 330 or cold plate 330. The second chamber 320 may be in fluid communication with the first chamber 310 via a plurality of passageways. The plurality of passageways may be offset from a center of the impeller 340, but eventually ultimately maintain fluid communication with the impeller 340.

In another example embodiment, the heat transfer apparatus 300 may include an inlet 312 affixed to a first opening or first aperture of the upper housing. The first opening may be proximate to a center of the upper housing, wherein the inlet 312 may be configured to receive a heat-transfer medium from an external source. The heat-transfer medium may be a liquid coolant, gas coolant, or any other type of heat absorbing medium known to those of ordinary skill in the art, as described above. The heat transfer apparatus 300 may be configured to allow the heat-transfer medium to flow into a reservoir that is in fluid communication with the inlet 312. The reservoir may be defined by a first chamber 310 and a second chamber 320, wherein the first chamber 310 may be horizontally offset from the second chamber 320.

In another example embodiment, the heat transfer apparatus 300 may include an outlet 314 affixed to a second opening or second aperture of the upper housing. The second opening may be horizontally offset from the center of the upper housing and the first opening, wherein the outlet 314 may be configured to transfer the heat-transfer medium from the pump 340 somewhere external to the heat transfer apparatus 300. The heat transfer apparatus 300 may be configured to allow the heat-transfer medium to flow out of the reservoir that is in fluid communication with the outlet 314. The heat transfer apparatus 300 may further include a fan fixture 350 include a fan 352 which may be removably secured to the upper housing.

In another example embodiment, the heat transfer apparatus 300 may be configured such that the impeller 340 may be disposed in the first chamber 310 defined between the upper housing and the lower housing. The upper housing may substantially include the first chamber 310 and the lower housing may substantially include the second chamber 320. The stator may be disposed directly beneath or underneath the first chamber 310.

Figure 4:
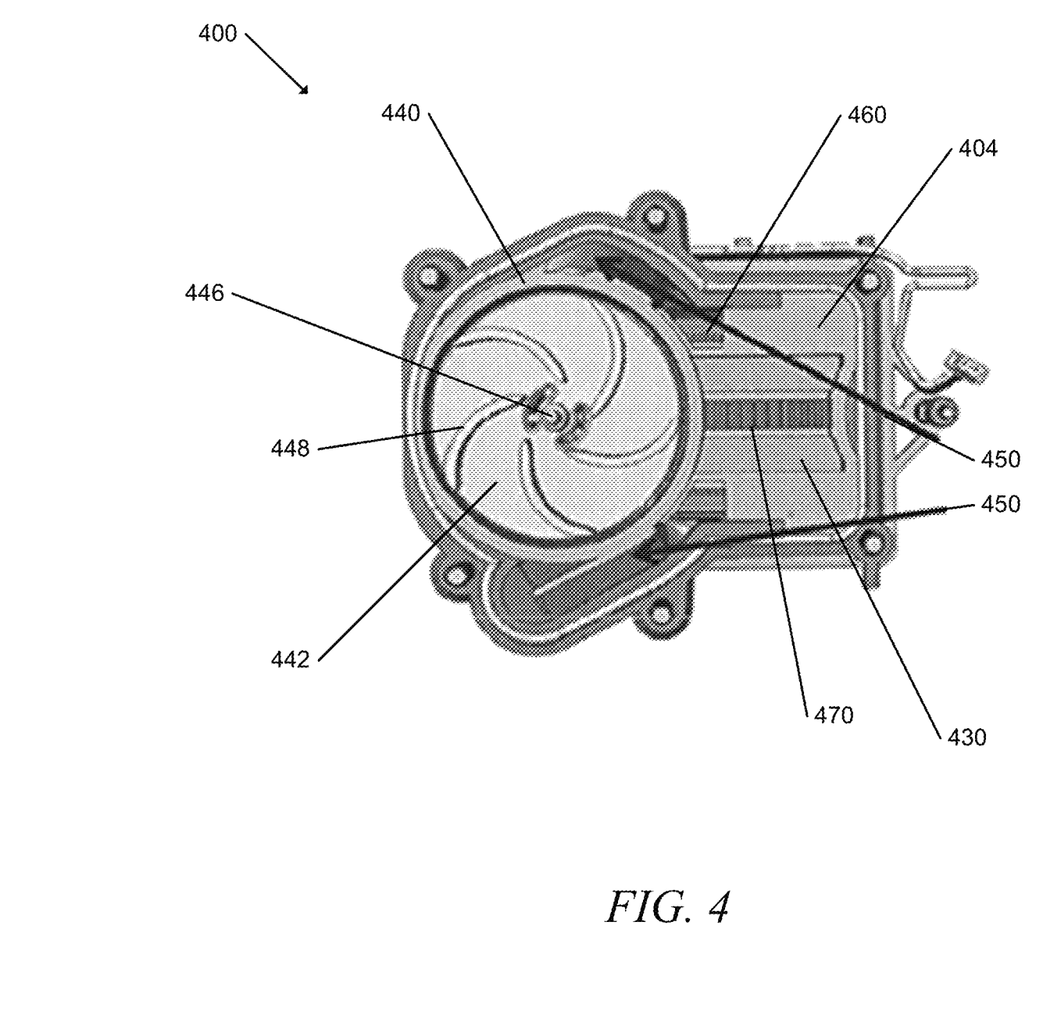
FIG. 4 is a cross-sectional top view of a heat transfer apparatus, according to an example embodiment.

According to another example embodiment, a heat transfer apparatus 400 is shown in FIG. 4. The heat transfer apparatus 400 may include a second chamber, wherein the first chamber—not shown—may be stacked on top of and fastened to the second chamber 420 to define an upper housing and a lower housing. The heat transfer apparatus 400 may also include a heat exchange interface 430 (or cold plate) that may be fixed to a bottom surface of the lower housing. The heat exchange interface 430 may be configured to absorb heat from a proximate heat generating device or heat source and transfer the absorbed heat to an inner surface of the lower housing. The heat transfer apparatus 400 may further include a pump 440 that may include an impeller 442 and a stator disposed within the pump 440. The lower housing 420 may be configured to separate the impeller 442 from the stator so that the stator is isolated from the impeller 442, as described above herein. The pump 440 may also include electric circuitry configured to energize the pump and its components according to the needs of the computing device of which the heat transfer apparatus 400 may serve.

The impeller 442 may include impeller blades 448 and a magnet ring (not shown). The magnet ring may be disposed within the inner structure of the impeller 442 such that the impeller blades 448 fan out from the magnet ring. However, the magnet ring may be a separate structure from the impeller blades 448 but still form the impeller 442 as a single unit. The impeller 442 may be fixed in an upward or downward orientation. Also, the impeller 442 may be positioned above, below or in vertical alignment with the stator 444. However, the impeller 442 may be aligned with the same planar axis as the stator—not shown—to allow impeller 442 movement substantially within the stator.

In another example embodiment, the heat transfer apparatus 400 may be configured such that the second chamber may be defined between the lower housing and the heat exchange interface 430 or cold plate 430. The second chamber may be in fluid communication with the first chamber via a plurality of passageways (channels) 450. The plurality of passageways 450 may be offset from a center of the impeller 442.

In another example embodiment, the heat transfer apparatus 400 may include an inlet affixed to a first opening or first aperture of the upper housing. The first opening may be proximate to a center of the upper housing, wherein the inlet may be configured to receive a heat-transfer medium from an external source. The inlet may be position to be directly above the shaft 446 such that the heat-transfer medium may flow through the inlet and into the pump where the shaft 446 is positioned. The heat-transfer medium may be a liquid coolant, gas coolant, or any other type of heat absorbing medium known to those of ordinary skill in the art, as described above. The heat transfer apparatus 400 may be configured to allow the heat-transfer medium to flow into a reservoir that is in fluid communication with the inlet. The reservoir may be defined by a first chamber and a second chamber, wherein the first chamber may be offset from the second chamber.

In another example embodiment, the heat transfer apparatus 400 may configured such that the impeller 442 may be disposed in the first chamber defined between the upper housing and the lower housing. The upper housing may substantially include the first chamber and the lower housing may substantially include the second chamber. The stator may be disposed directly beneath or underneath the first chamber.

In this example embodiment, the pump 440, when energized, may be configured to pull water in above the impeller 442 toward the center of the impeller 442, then accelerate the water with the impeller blades 448. The impeller blades 448 may be configured to rotate in a clock-wise or counter-clock-wise direction, thereby changing the direction of accelerating the water correspondingly. Further, the impeller blade 448 angles and accompanying centrifugal force applies a proportional force to the water to force the water outward and through one or several of the channels 450. If the water flows from the first chamber to the second chamber, the channels 450 may lead separately or combined into the second chamber. If the water flows from the first chamber to the second chamber, then the channels outside the impeller 442 may guide the water to a nozzle which may be connected to a hose.

In another example embodiment, the pump 440 may be configured to pull water in above the impeller 442 to the center of the impeller 442, then accelerate the water with the impeller blades 448 and outwards into the channels 450. The channels 450 may then guide the water to the entrance of the second chamber 460 from where it enters the channels formed by the fins or grooves 470 of the cold plate 430. From there, the water may then flow along the guides in the lower housing of the first chamber. Once the water is in the lower housing of the second chamber, the water may be forced to flow up through the outlet of the upper housing and out of the enclosure.

The shaft 446 may be configured to be fixed to the impeller 442 and be disposed within a groove in the upper housing to hold the shaft 446 in position. The shaft 446 may need to be held in position due to a low pressure zone created by the pump 440, which creates an uplift to the impeller 442. By fixing the shaft 446 to the impeller 442, the shaft 446 is supported to withstand the low pressure zone and force applied to the impeller 442. This may reduce the noise and friction that may be created by the effects of the low pressure zone within the pump 440 of the heat transfer apparatus 400. The impeller 442 may also include a bearing and the shaft 446 may be fixed to the lower housing. By fixing the shaft 446 to the lower housing, the impeller 442 may be held in position by a magnet or a washer.

Figure 5:
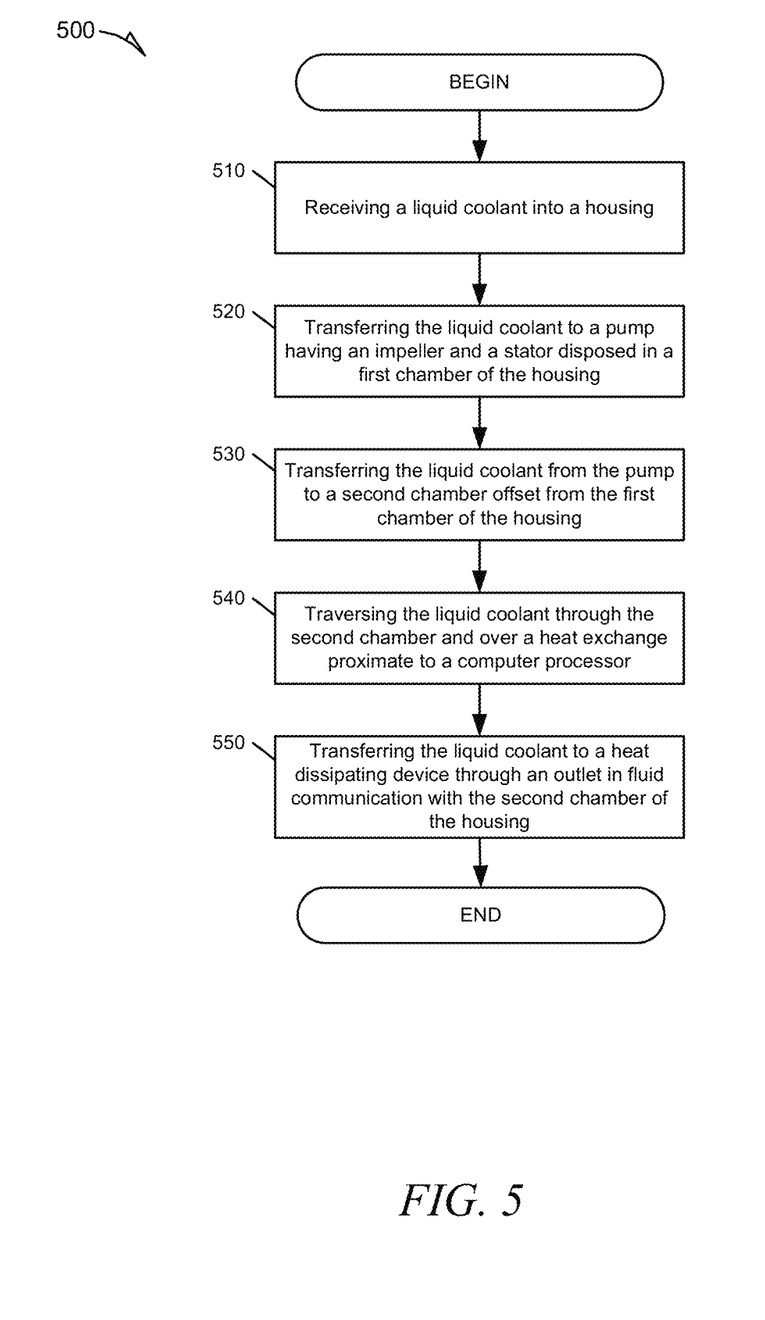
FIG. 5 is a flow diagram showing a method for transferring heat from a processor, according to an example embodiment.

In yet an example embodiment, a method for cooling a processor is described. The method 500 may include receiving 510 a liquid coolant into a housing. The liquid coolant may be received into the housing via an inlet in fluid communication with a first chamber in the housing. The method 500 may further include transferring 520 the liquid coolant to a pump having an impeller and a stator disposed in the first chamber of the housing.

The method 500 may further include transferring 530 the liquid coolant from the pump or the first chamber to a second chamber offset from the first chamber of the housing. The method 500 may further include traversing the liquid coolant through the second chamber and over a heat exchange interface proximate to a computer processor. The method 500 may further include transferring the liquid coolant to a heat dissipating device through an outlet in fluid communication with the second chamber of the housing.

In another example embodiment, the method 500 may further include receiving the liquid coolant into an inlet of the upper portion of the housing. The method 500 may also include traversing the liquid coolant out from the second chamber through an outlet of the upper portion of the housing, wherein the outlet is in fluid communication with the second chamber. When traversing the liquid coolant over the heat exchange interface, the liquid coolant may absorb heat from the heat exchange interface, thereby reducing a temperature of the heat exchange device.

The method 500 may further include transferring the liquid coolant from the pump to a second chamber via the second chamber via at least one passageway that may be offset from a center of the impeller. The at least one passageway may also be in alignment with the center of the impeller or may be arranged in another configuration that allows the liquid coolant to flow throughout the reservoir. In other words, the at least one passageway is not limited to be offset from the center of the impeller, but may be arranged otherwise to allow fluid communication between the first chamber and the second chamber.

The method 500 may further include transferring the liquid coolant to a heat dissipating device that may be in fluid communication with the outlet.

In another example embodiment, a method for cooling a processor by removing heat from its components may include receiving a liquid coolant into a housing, transferring the received liquid coolant to a second chamber having a heat exchange interface attached to a bottom surface of the second chamber, traversing the liquid coolant through the second chamber and over the heat exchange interface proximate to a computer processor. The method may further include transferring the liquid coolant from the second chamber through one or more passages to a first chamber positioned about the center of pump having an impeller and stator. The method may further include transferring the liquid coolant from the impeller to an outlet extending through an aperture in an upper surface of the first chamber, wherein the outlet provides fluid communication to a heat dissipating device. In other words, in this method, the liquid coolant may flow in an opposite direction and in the opposite manner in which the liquid coolant flows described in method 500 above.

Alternatively, the inlet and outlet may be extended through an aperture in the lower housing, wherein the inlet may be configured to receive a liquid coolant for distribution throughout the reservoir and the outlet may be configured to expel the liquid coolant out from the reservoir to a heat dissipation device. The particular positions of the inlet and outlet are not necessarily fixed and may be placed at any location so long as the inlet and outlet perform the functions as described here. For example, the inlet may be configured to bring water about the center of the impeller of the first chamber, or bring water about the center of the impeller of the second chamber if reverse flow is the designed flow.

As another alternative embodiment, the internal components of the heat transfer apparatus may be positioned in reverse of the embodiments described above herein. For example, the impeller can be positioned such that the impeller blades are facing down within the reservoir. In this configuration, the upper casing may be configured to separate the impeller and magnet from the stator.

Also, the heat transfer apparatus may be configured to allow the liquid coolant to flow in a direction that is opposite to the flow direction described above herein. For example, the liquid coolant may be provided into the outlet and transferred to the second chamber, then through the first chamber, and out through the inlet. In this example embodiment, the liquid coolant would still flow over the cold plat and then to the pump in the first chamber. Nonetheless, the first chamber may still be horizontally offset from the second chamber as described above herein.

The following description is presented to enable any person skilled in the art to create and use apparatuses, systems and methods described herein provide for cooling a processor using a dual-chamber cooling liquid circulation device. The relative motion of the blades to the fluid adds velocity or pressure or both to the fluid as it passes through the impeller. The fluid velocity is increased through the impeller, and the stator converts kinetic energy to pressure energy. The increase in velocity of the fluid is primarily in the tangential direction (swirl) and the stator removes this angular momentum.

Various modifications to the example embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention may be practiced without the use of these specific details. In other instances, well-known structures and processes are shown in block diagram form in order not to obscure the description of the invention with unnecessary detail. Thus, the present disclosure is not intended to be limited to the embodiments shown, but is to be accorded the widest scope consistent with the principles and features disclosed herein.

In describing exemplary embodiments, specific terminology is used for the sake of clarity. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other embodiments, functions and advantages are also within the scope of the invention.

Exemplary flowcharts are provided herein for illustrative purposes and are non-limiting examples of methods. One of ordinary skill in the art will recognize that exemplary methods may include more or fewer steps than those illustrated in the exemplary flowcharts, and that the steps in the exemplary flowcharts may be performed in a different order than the order shown in the illustrative flowcharts.

What is claimed is:

1. A heat transfer apparatus for a computer component, said apparatus comprising: an enclosure formed of an upper housing stacked on top of and fastened to a lower housing, the enclosure comprising:
   a first chamber horizontally offset from a second chamber;
   a pump comprising an impeller disposed within a stator, the impeller and stator disposed within the lower housing of the enclosure;
   an inlet disposed in a first aperture proximate to a center of the upper housing;
   an outlet disposed in a second aperture horizontally offset from the center of the upper housing, wherein the inlet is in fluid communication with the pump in the first chamber and the outlet is in fluid communication with the second chamber; and a cold plate fixed to a bottom surface of the lower housing and the second chamber, the cold plate configured to transfer heat from an adjacent heat source into the second chamber.

2. The heat transfer apparatus of claim 1, further comprising a fan fixture removably secured to the upper housing, the fan fixture comprising a first opening to receive the inlet and a second opening to receive the outlet and a fan horizontally offset from the first opening and the second opening, the fan, when energized circulates air throughout an immediate environment.

3. The heat transfer apparatus of claim 1, wherein the impeller comprises impeller blades arranged uniformly around a top surface of the impeller and extending out from a shaft fixed at a center of the impeller.

4. The heat transfer apparatus of claim 1, wherein the impeller comprises a magnet ring disposed within an inner structure of the impeller such that the impeller is partially secured around a shaft within the stator by a magnetic field generated by the magnetic ring.

5. The heat transfer apparatus of claim 1, wherein the second chamber is defined between the lower housing and the cold plate.

6. The heat transfer apparatus of claim 1, wherein the second chamber is in fluid communication with the first chamber via a least one passageway offset from a center of the impeller.

7. A system for cooling a central processor within a computing device, said system comprising:
   a heat transfer apparatus comprising:

a housing defined by an upper portion stacked upon and fastened to a lower portion to form a first chamber horizontally offset from a second chamber;

a reservoir disposed within the first chamber and the second chamber, the reservoir comprising a plurality of channels configured to allow fluid communication from the first chamber to the second chamber;

a pump comprising an impeller disposed within the first chamber defined between the upper portion and the lower portion, the pump further comprising a stator disposed directly beneath the first chamber; and a heat exchange interface fixed to the housing to define a bottom surface of the housing, wherein a top surface of the computer processor is coupled to or adjacent to a bottom surface of the heat exchange interface of the heat transfer apparatus.

8. The system according to claim 7, further comprising:
an inlet disposed in a first aperture proximate to a center of the upper portion of the housing, the inlet is in fluid communication with the first chamber.

9. The system according to claim 8, further comprising:
an outlet disposed in a second aperture offset from the center of the upper portion of the housing, the outlet in fluid communication with the second chamber.

10. The system according to claim 9, wherein the heat exchange interface is configured to absorb heat therein and transfer the heat to a liquid coolant that passes over the heat exchange interface.

11. The system according to claim 10, wherein the liquid coolant is configured to absorb the heat and flow through the outlet to a heat dissipating device.

12. The system according to claim 7, wherein the plurality of channels are offset from a center of the impeller.

13. The system according to claim 7, wherein the lower portion separates the impeller from the stator to isolate the stator from the impeller.

14. A method for cooling a heat generating computer component, said method comprising the steps of:

receiving a liquid coolant into a housing;

transferring the liquid coolant to a pump comprising an impeller and a stator, wherein the pump is disposed in a first chamber of the housing, the first chamber defined between an upper portion and a lower portion of the housing;

transferring the liquid coolant from the pump to a second chamber horizontally offset from the first chamber of the housing, the second chamber comprising a heat exchange interface affixed to a first bottom surface of the second chamber, wherein the first bottom surface substantially defines a second bottom surface of the housing; and traversing the liquid coolant over the heat exchanging interface and out from the second chamber.

15. The method according to claim 14, wherein the receiving the liquid coolant further comprises receiving the liquid coolant into an inlet of the upper portion of the housing.

16. The method according to claim 14, further comprising traversing the liquid coolant out from the second chamber through an outlet of the upper portion of the housing, the outlet in fluid communication with the second chamber.

17. The method according to claim 16, further comprising transferring the liquid coolant to a heat dissipating device in fluid communication with the outlet.

18. The method according to claim 14, further comprising absorbing, at least by the liquid coolant, heat from the heat exchange interface to reduce a temperature of the heat exchange interface.

19. The method according to claim 14, further comprising transferring the liquid coolant from the pump to the second chamber via a plurality of passageways that are offset from a center of the impeller.

20. The method of claim 14, further comprising circulating air throughout the immediate environment of the housing.

* * * * *